(12) United States Patent
Burnett, II et al.

(10) Patent No.: US 9,103,855 B2
(45) Date of Patent: Aug. 11, 2015

(54) RADIATION SIGNAL MEASUREMENT SYSTEM FOR MILLIMETER WAVE TRANSCEIVERS

(71) Applicant: INTERNATIONAL BUSINESS MACHINES CORPORATION, Armonk, NY (US)

(72) Inventors: Randall M. Burnett, II, Fishkill, NY (US); Hanyi Ding, Colchester, VT (US); Kai D. Feng, Hopewell Junction, NY (US); Donald J. Papae, Hopewell Junction, NY (US); Francis F. Szenher, Fihskill, NY (US)

(73) Assignee: International Business Machines Corporation, Armonk, NY (US)

( * ) Notice: Subject to any disclaimer, the term of this patent is extended or adjusted under 35 U.S.C. 154(b) by 316 days.

(21) Appl. No.: 13/650,487

(22) Filed: Oct. 12, 2012

(65) Prior Publication Data

US 2014/0104092 A1    Apr. 17, 2014

(51) Int. Cl.
*G01S 7/40* (2006.01)
*G01R 29/08* (2006.01)
*G01S 3/02* (2006.01)

(52) U.S. Cl.
CPC ............. *G01R 29/0821* (2013.01); *G01S 3/023* (2013.01); *G01S 2007/4086* (2013.01)

(58) Field of Classification Search
CPC ........................ G01S 2007/4086; G01S 3/023

USPC .......................... 342/165, 167, 173–174, 360
See application file for complete search history.

(56) References Cited

U.S. PATENT DOCUMENTS

| | | | |
|---|---|---|---|
| 6,104,291 A * | 8/2000 | Beauvillier et al. | 340/572.1 |
| 6,329,952 B1 * | 12/2001 | Grace | 343/703 |
| 6,809,806 B1 * | 10/2004 | Carnevale et al. | 356/141.2 |
| 7,791,355 B1 * | 9/2010 | Esher et al. | 324/637 |
| 8,018,380 B2 | 9/2011 | Oh et al. | |
| 8,201,338 B2 * | 6/2012 | Tsai et al. | 33/228 |
| 2010/0005670 A1 * | 1/2010 | Tsai et al. | 33/228 |
| 2010/0233969 A1 * | 9/2010 | Frolik et al. | 455/67.14 |
| 2011/0133977 A1 * | 6/2011 | Park et al. | 342/1 |
| 2012/0262331 A1 * | 10/2012 | Kienzle et al. | 342/124 |
| 2013/0271317 A1 * | 10/2013 | Goel et al. | 342/357.62 |

* cited by examiner

*Primary Examiner* — John B Sotomayor
*Assistant Examiner* — Marcus Windrich
(74) *Attorney, Agent, or Firm* — Joseph Petrokaitis; Yuanmin Cai; Howard M. Cohn

(57) ABSTRACT

A radiation signal measurement system for millimeter wave transceivers is disclosed. Embodiments of the present invention utilize a laser to align the laser with an antenna. The transceiver is then moved into the path of the laser to align the laser with the transceiver. The transceiver or antenna orientation is changed such that the transceiver and antenna face each other, in an aligned position. Millimeter wave absorber material is applied to the inside and outside of the testing chamber to minimize reflections and interference from outside sources.

19 Claims, 9 Drawing Sheets

RADIATION SIGNAL MEASUREMENT SYSTEM FOR MILLIMETER WAVE TRANSCEIVERS

FIELD OF THE INVENTION

The present invention relates broadly to radio frequency measurement instrumentation, and in particular, to a radiation signal measurement system for millimeter wave transceivers.

BACKGROUND OF THE INVENTION

In recent years an increased interest in millimeter-wave systems has developed. As component technology matures, significant efforts are being made to exploit the advantages that this spectral range offers. As millimeter systems evolve, it is desirable to have improved instrumentation and measurement techniques for system evaluation.

SUMMARY OF THE INVENTION

In one embodiment of the present invention, an electromagnetic wave testing apparatus is provided, comprising a chamber, an antenna shaft disposed within the chamber, a control shaft affixed to the antenna shaft, an antenna mount, the antenna mount movably attached to the antenna shaft, an antenna affixed to the antenna mount, a laser pointer mounted to the antenna shaft, the laser pointer configured and disposed to emit a laser beam onto the antenna, and a transceiver holder, the transceiver holder configured and disposed to be moved such that the transceiver holder is positioned in the laser beam.

In another embodiment of the present invention, an electromagnetic wave testing apparatus is provided, comprising a chamber, an antenna shaft disposed within the chamber, an antenna mount, attached to the antenna shaft, an antenna affixed to the antenna mount, a laser pointer mounted to the antenna shaft, the laser pointer configured and disposed to emit a laser beam onto the antenna, a control shaft positioned within the chamber, a horizontal transceiver support mounted to the control shaft, and a slidable transceiver holder slidably attached to the horizontal transceiver support.

In another embodiment of the present invention, a method of configuring an electromagnetic wave testing chamber is provided, comprising aligning a laser pointer and an antenna, wherein the laser pointer and the antenna are mounted on opposite ends of an antenna shaft, orienting the antenna shaft to a transceiver alignment position, aligning the laser pointer and the a transceiver under test, orienting the antenna shaft to a test position, such that the antenna is aligned to the transceiver under test.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. In some cases, in particular pertaining to signals, a signal name may be oriented very close to a signal line without a lead line to refer to a particular signal, for illustrative clarity.

Figure 1:
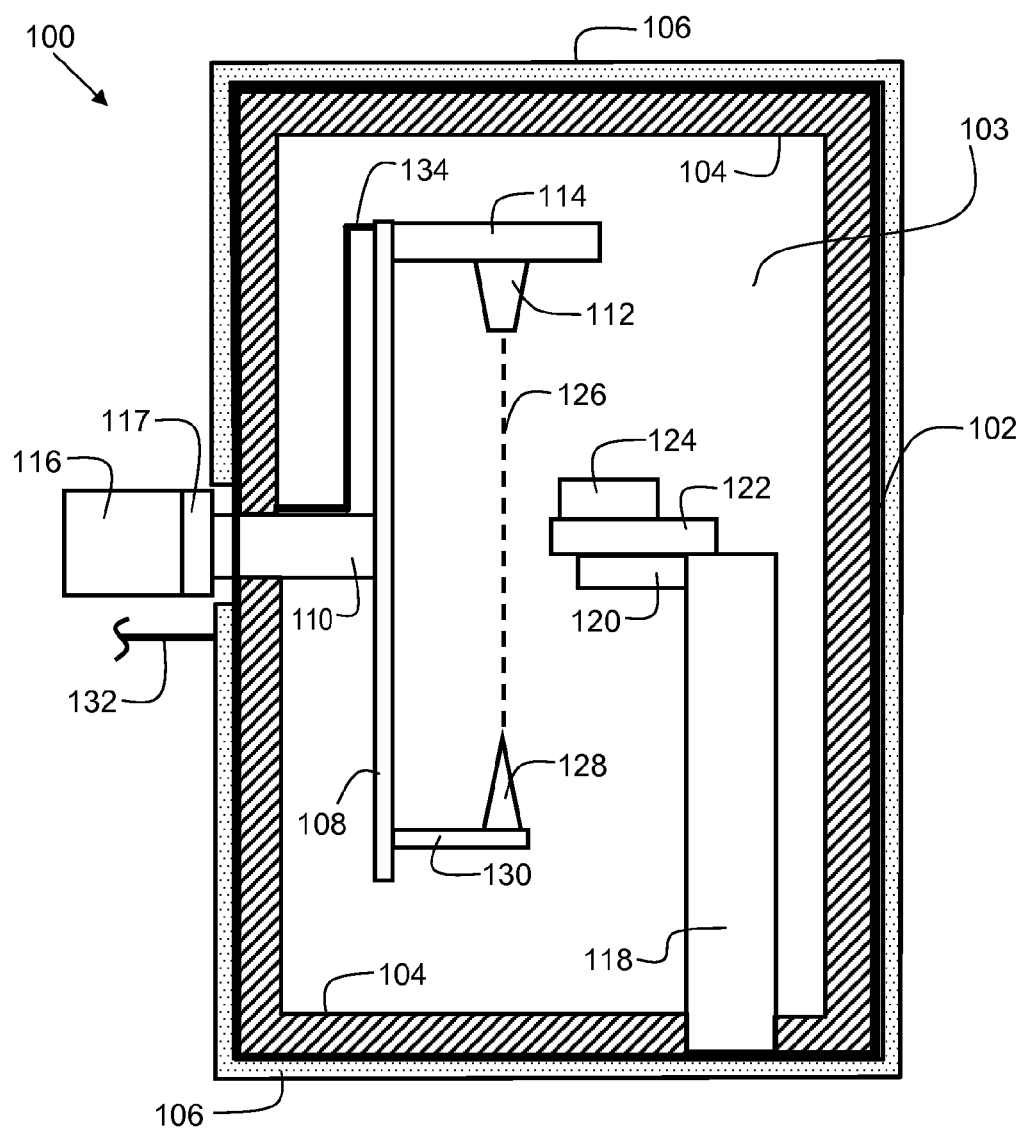

Similar elements may be referred to by similar numbers in various figures (FIGS.) of the drawing, in which case typically the last two significant digits may be the same, the most significant digit being the number of the drawing figure (FIG). Furthermore, for clarity, some reference numbers may be omitted in certain drawings.

FIG. 1 shows a side view of a first embodiment of the present invention in an antenna alignment configuration.

Figure 2:
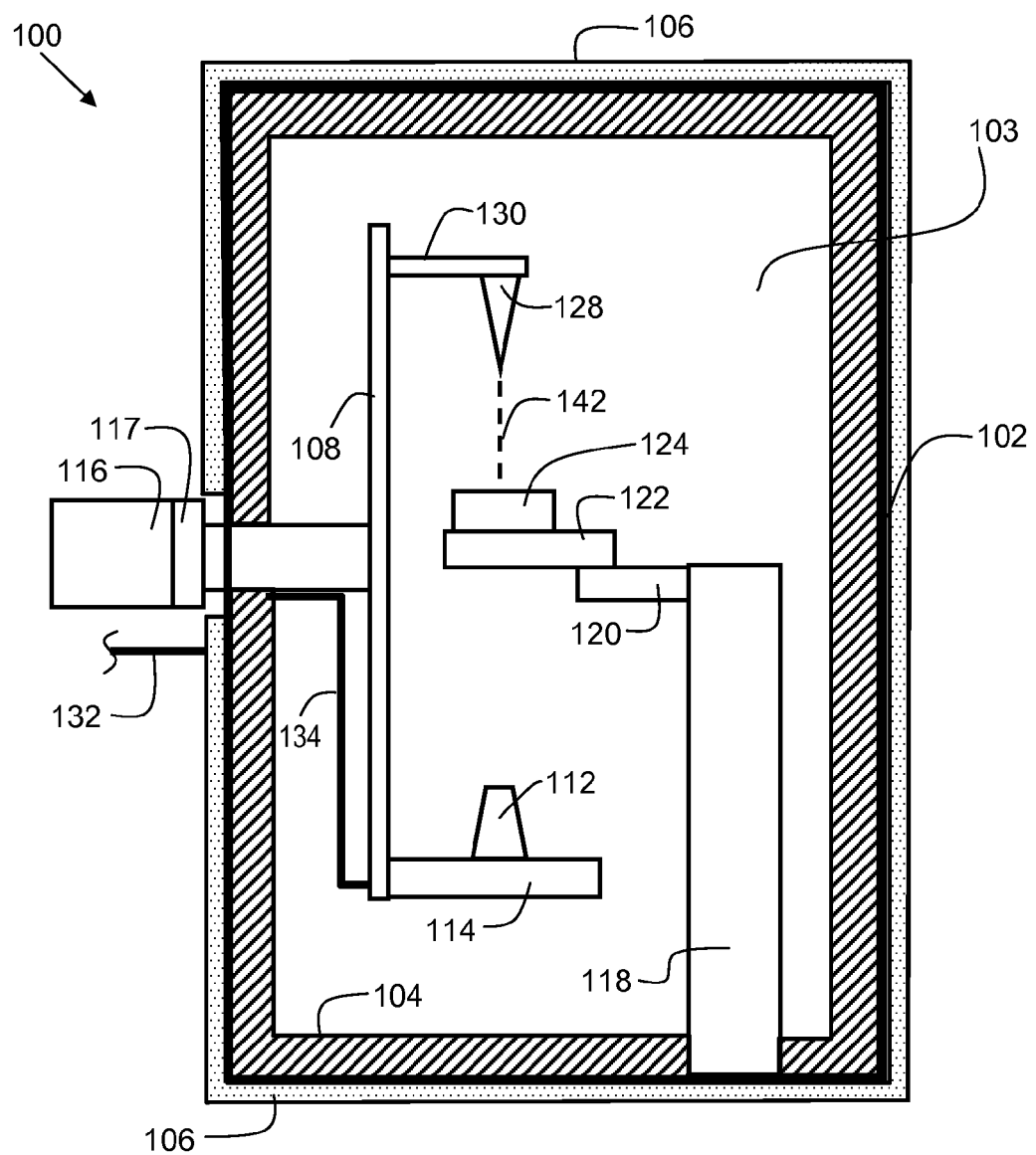

FIG. 2 shows a side view of a first embodiment of the present invention in a transceiver alignment configuration.

Figure 3:
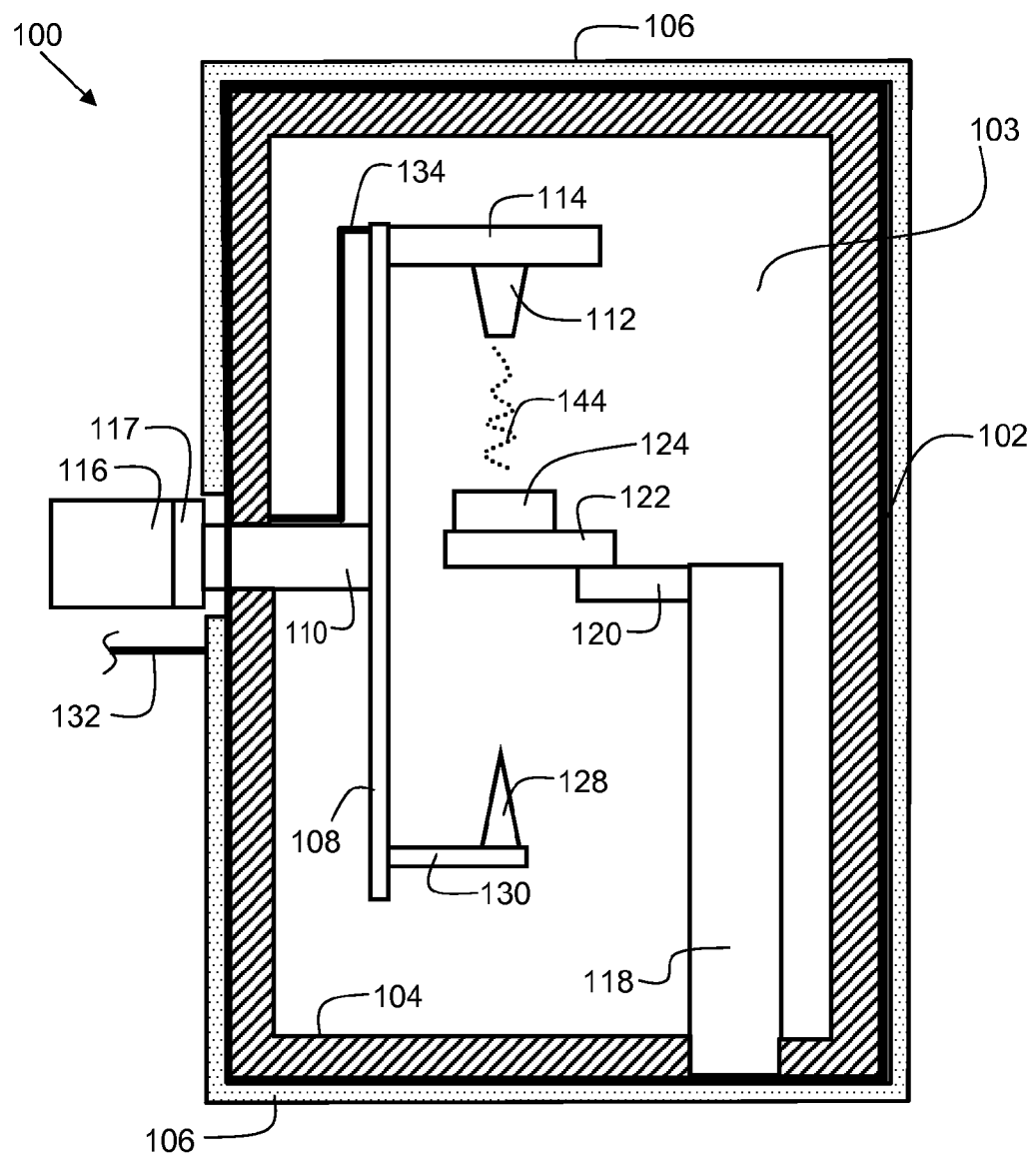

FIG. 3 shows a side view of a first embodiment of the present invention in a test configuration.

Figure 4:
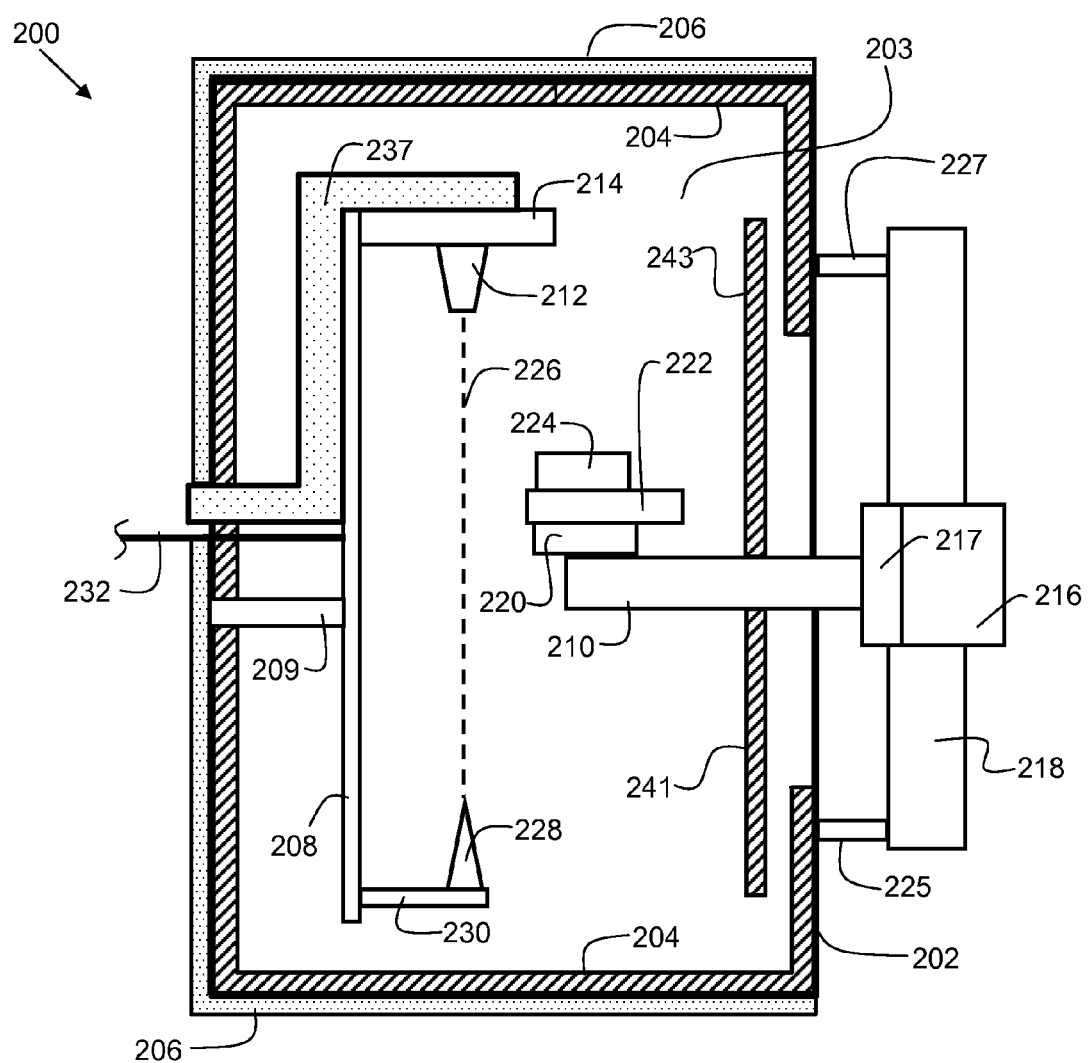

FIG. 4 shows a side view of a second embodiment of the present invention in an antenna alignment configuration.

Figure 5:
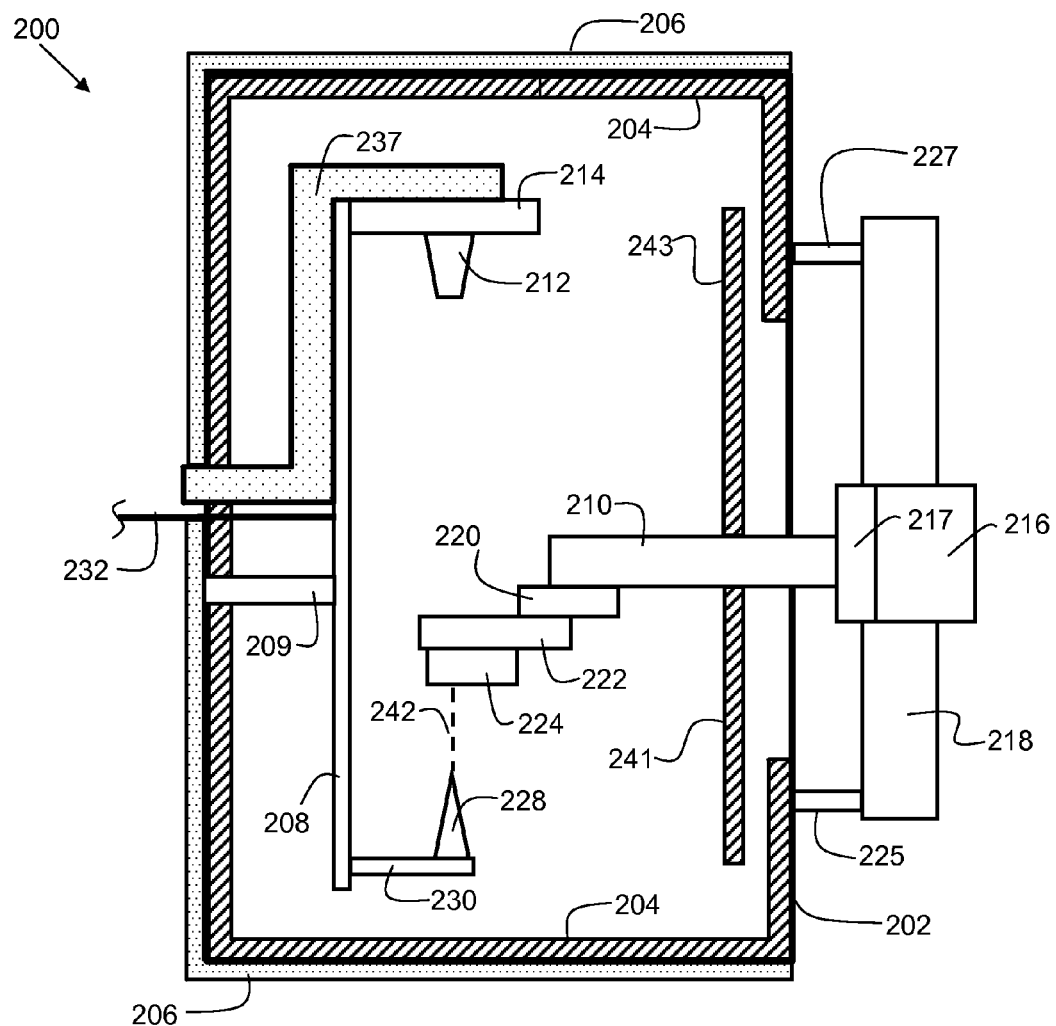

FIG. 5 shows a side view of a second embodiment of the present invention in a transceiver alignment configuration.

Figure 6:
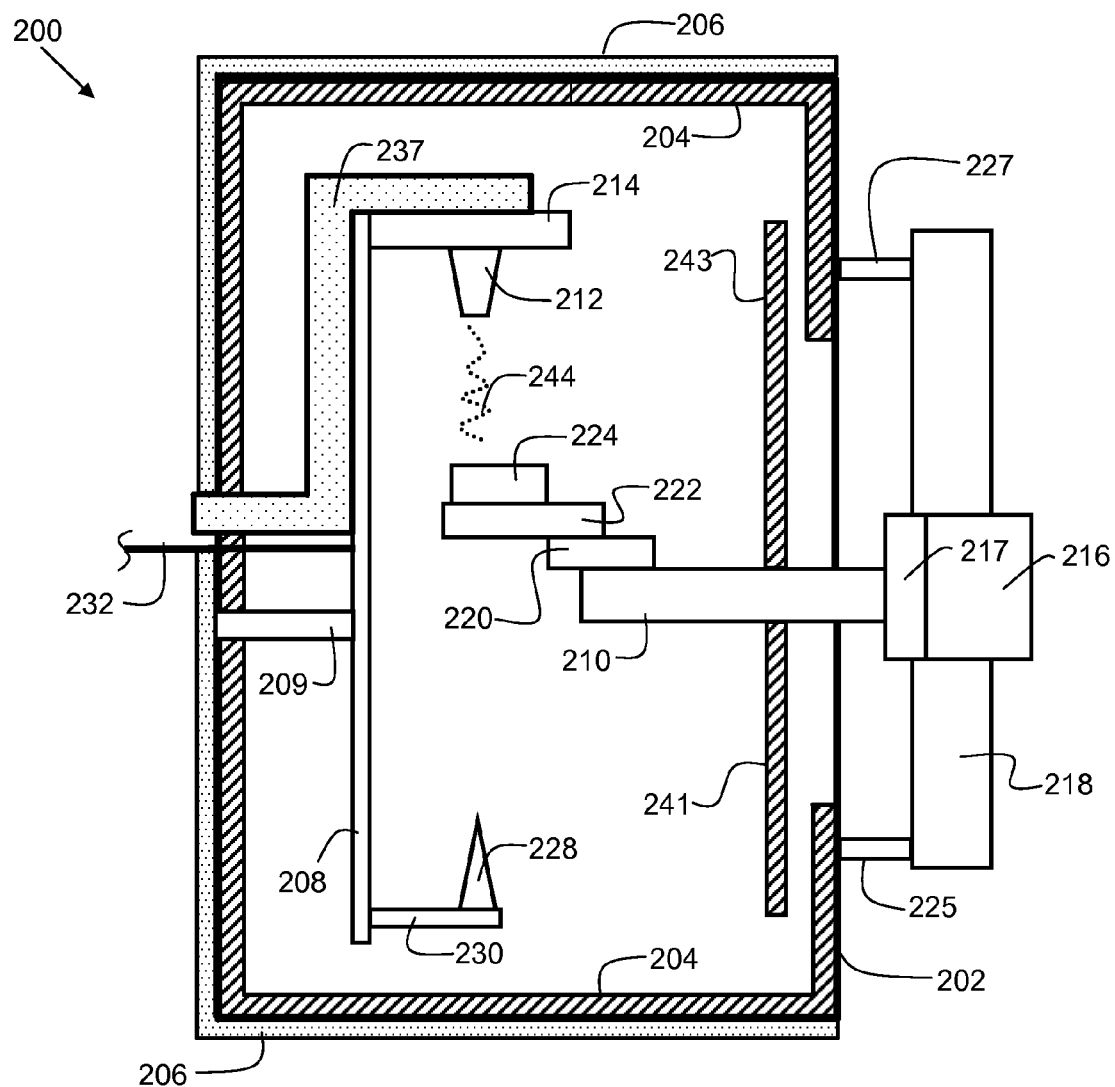

FIG. 6 shows a side view of a second embodiment of the present invention in a test configuration.

Figure 7:
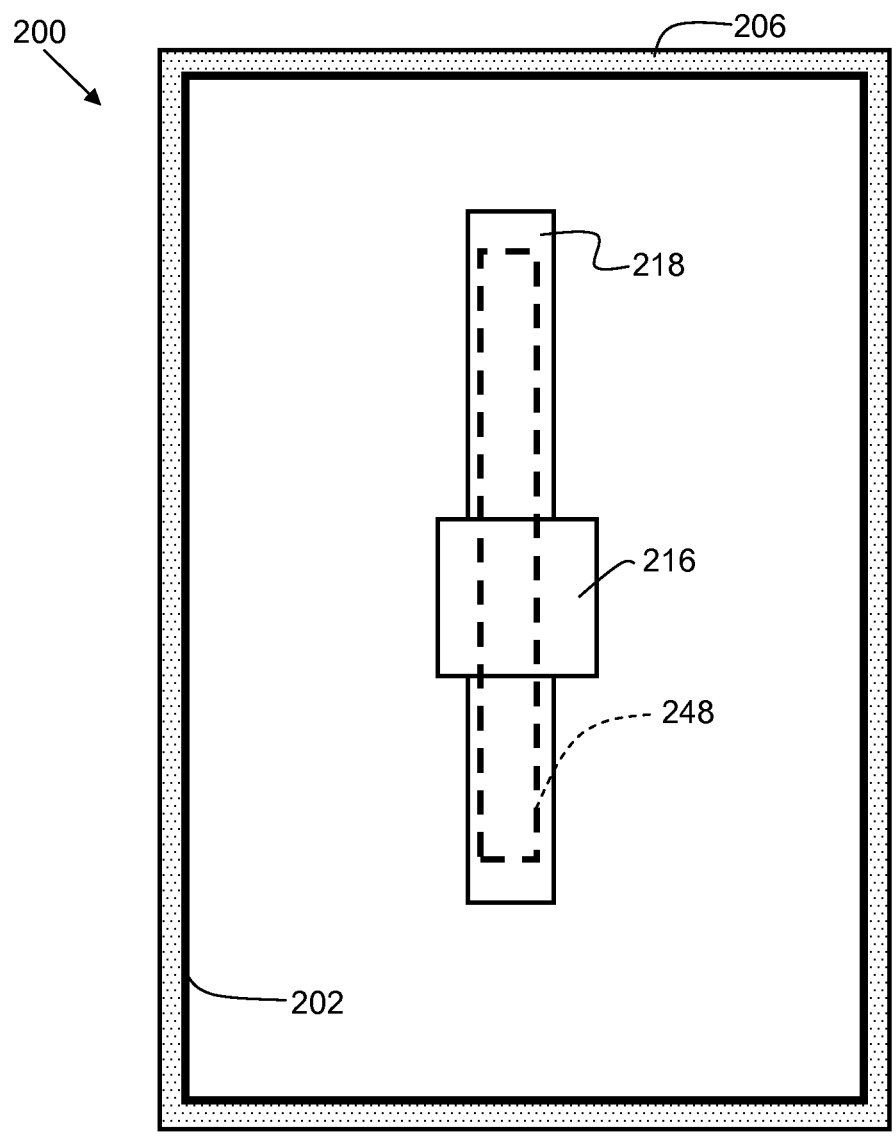

FIG. 7 is a rear view of a second embodiment of the present invention.

Figure 8:
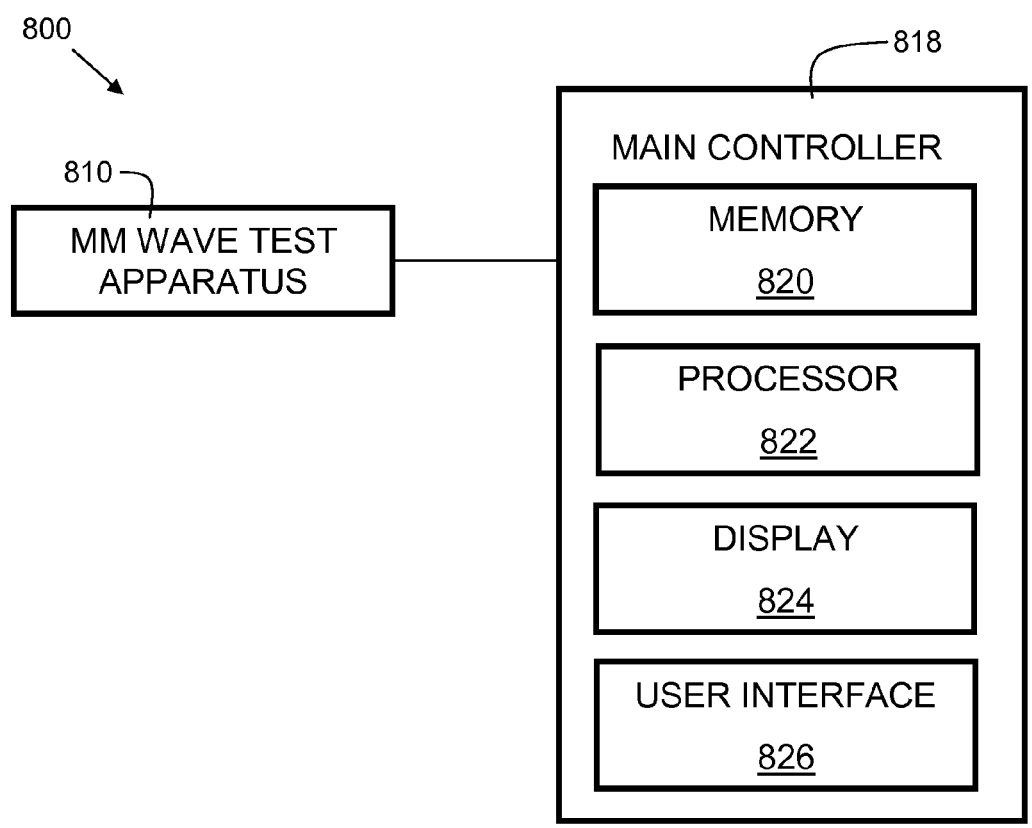

FIG. 8 is a block diagram of a system in accordance with an embodiment of the present invention.

Figure 9:
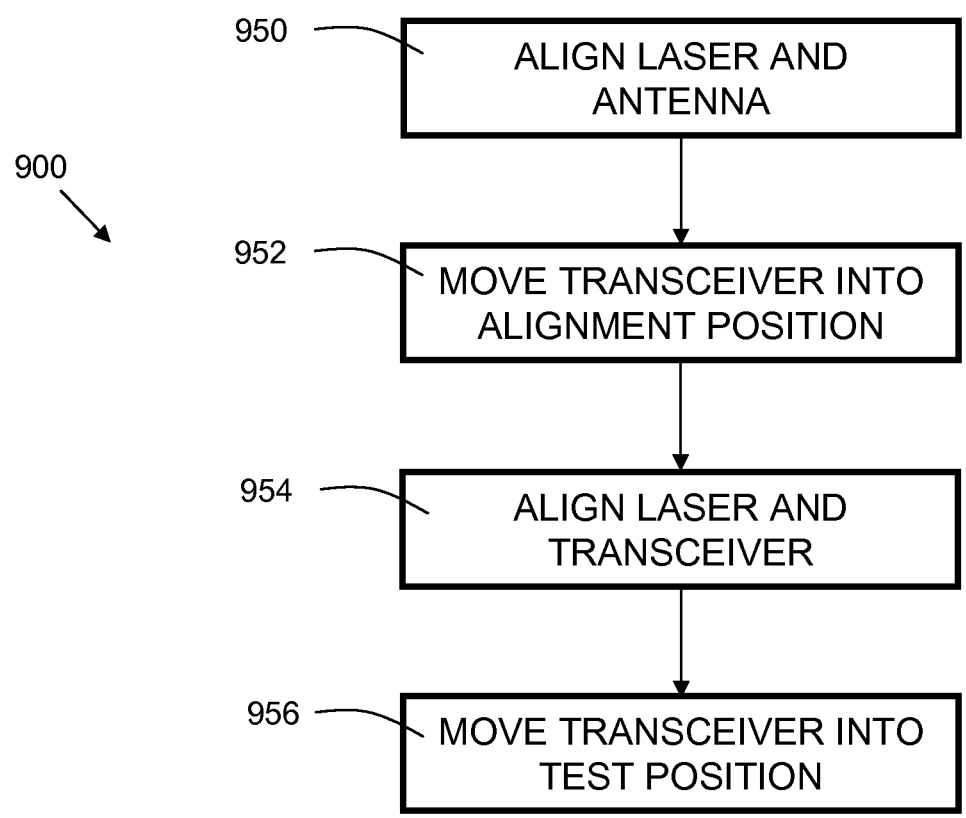

FIG. 9 is a flowchart for a method in accordance with an embodiment of the present invention.

DETAILED DESCRIPTION

Performing radiation measurements on a millimeter wave transceiver is very challenging. One challenge is the requirement of an environment free of reflections. Any surrounding metal objects, even those as small as a millimeter, can cause significant interference. Another challenge is the precision of alignment. The size of an antenna is proportional to the wavelength of the signal to be transmitted or received. For millimeter wave communication, the antenna size can be on the order of millimeters, which requires an accurate alignment between the measurement antenna and the antenna under test. Without such alignment, a large measurement error can occur. Embodiments of the present invention provide a system and method with reduced reflections and interference and improved alignment, to address these challenges.

FIG. 1 shows a side view of an electromagnetic wave testing system 100 in accordance with an embodiment of the present invention in an antenna alignment configuration. System 100 comprises chamber surface 102. Chamber surface 102 is preferably fabricated from non-metal material such as plastic, fiberglass, or wood. The interior side of chamber surface 102 is lined with millimeter wave absorber material 104. The outside of chamber surface 102 is lined with millimeter wave absorber material 106. The material used for the inside millimeter wave absorber material 104 and the outside millimeter wave absorber material 106 may be the same material or they may be two different materials. In one embodiment, the inside/outside millimeter wave absorber material is comprised of titanium dioxide and epoxy resin containing carbon particles. In another embodiment, the inside/outside millimeter wave absorber material is comprised of epoxy-modified urethane rubber mixed with carbon particles. In another embodiment, the inside/outside millimeter wave absorber material is comprised of polyester nonwoven cloth. The non-metal chamber, lined on both sides with millimeter wave absorber material, serves to reduce internal reflections and unwanted interference from outside sources that could adversely affect measurements within the system 100.

An antenna shaft 108 is disposed within the chamber 103. At one end of the antenna shaft 108 is an antenna mount 114. An antenna 112 is affixed to antenna mount 114. At the opposite end of antenna shaft 108 is laser mount 130. A laser pointer 128 is affixed to laser mount 130. Laser pointer 128 comprises a laser and associated optics for emitting a focused beam of visible light. An electronics cable 134 contains a plurality of electrical conduits for powering, signaling, and controlling antenna 112 and laser pointer 128. Electronics cable 134 is routed to the outside of the chamber to exterior electronics cable 132, which may be connected to external power supplies, signal sources, amplifier and controllers (not shown).

The antenna shaft 108 is affixed to a control shaft 110. The control shaft 110 is mechanically coupled to a motor 116. A position encoder 117 may optionally be used to more precisely establish the angular (rotational) position of the control shaft. In one embodiment, position encoder 117 is a rotational position encoder configured and disposed to indicate a rotational, or angular position of the control shaft. During use, the motor 116 is activated to move the control shaft, hence moving the antenna shaft to different positions during setup and testing phases.

A transceiver support post 118 is mounted to the base of the chamber surface 102. Affixed to the transceiver support post 118 is horizontal transceiver support 120. A slidable transceiver holder 122 is slidably mounted to the horizontal transceiver support 120. A transceiver under test 124 is mounted to the transceiver holder 122 during use.

It is desirable to limit the use of metal within the chamber 103 to avoid undesired reflections during test. Antenna shaft 108 and transceiver support post 118 may be comprised of a rigid, non-metal material, such as polyoxymethylene (i.e. "DELRIN" manufactured by DuPONT of Wilmington, Del.).

As shown in FIG. 1, system 100 is in an antenna alignment configuration. The transceiver 124 is positioned such that it is not in the path of laser beam 126 emitted from laser pointer 128. The laser beam 126 is aligned to the center of antenna 112. The aligning comprises emitting laser beam 126 from laser pointer 128 onto the center of antenna 112. The alignment may be confirmed by visual inspection by an operator. The laser pointer 128 and antenna 112 may be fine-adjusted on laser mount 130 and antenna mount 114, respectively. This step ensures that the laser pointer 128 is aligned with the antenna 112.

FIG. 2 shows a side view of system 100 in accordance with an embodiment of the present invention in a transceiver alignment configuration. In order to place system 100 into the transceiver alignment configuration, the motor 116 is operated to rotate the antenna shaft 108 to a position that is 180 degrees from the antenna alignment configuration shown in FIG. 1. In one embodiment, motor 116 is a stepper motor. The stepper motor may be used to precisely identify the 180 degree position for the transceiver alignment configuration. A positional encoder 117 may also be used to achieve additional positional accuracy. The transceiver 124 is positioned to be in the path of laser pointer 128, and the transceiver 124 is positioned such that laser beam 142 is applied to the center of the antenna (or other desired location) of transceiver 124. The laser beam position may be confirmed by visual inspection by an operator.

FIG. 3 shows a side view of system 100 in accordance with an embodiment of the present invention in a test configuration. The motor 116 is activated to return the antenna shaft 108 to a position that is 180 degrees from the transceiver alignment configuration of FIG. 2. The antenna 112 is now aligned with a corresponding antenna on transceiver 124. The antenna 112 then may be configured to emit electromagnetic waves 144 to test the transceiver 124.

FIG. 4 shows a side view of a system 200 in accordance with a second embodiment of the present invention in an antenna alignment configuration. In this embodiment, the antenna shaft 208 is disposed within chamber 203 and affixed to the chamber surface 202 via antenna shaft mount 209. A rigid waveguide 237 supplies electromagnetic energy input to antenna 212. Therefore, in this embodiment, instead of rotating the antenna shaft as in the embodiment of system 100 (FIGS. 1-3), the antenna shaft 208 of system 200 is fixed in position. Instead, the control shaft 210 rotates to change orientation of the transceiver 224. Control shaft 210 is mechanically coupled to motor 216. Motor 216 may be a stepper motor. A positional encoder 217 may also be used to achieve greater positional accuracy.

A transceiver support post 218 is mounted to the outside of the chamber surface 202 via transceiver support mounts 225 and 227. The motor 216 and control shaft 210 are movable up and down the transceiver support post 218 to provide vertical adjustment, which allows varying the distance between antenna 212 and transceiver 224 during test.

System 200 comprises chamber surface 202. Chamber surface 202 is preferably fabricated from non-metal material such as plastic, fiberglass, or wood. The interior side of chamber surface 202 is lined with millimeter wave absorber material 204. The outside of chamber surface 202 is lined with millimeter wave absorber material 206. The material used for the inside millimeter wave absorber material 204 and the outside millimeter wave absorber material 206 may be the same material or they may be two different materials. In one embodiment, the inside/outside millimeter wave absorber material is comprised of titanium dioxide and epoxy resin containing carbon particles. In another embodiment, the inside/outside millimeter wave absorber material is comprised of epoxy-modified urethane rubber mixed with carbon particles. In another embodiment, the inside/outside millimeter wave absorber material is comprised of polyester nonwoven cloth. The non-metal chamber, lined on both sides with millimeter wave absorber material, serves to reduce internal reflections and unwanted interference from outside sources that could adversely affect measurements within the system 200.

A millimeter wave absorber material region 243 is mounted to the control shaft 210, parallel to the sides of the chamber surface 202. As similar millimeter wave absorber material region 241 is mounted to the control shaft 210 opposite region 243, parallel to the sides of the chamber surface 202. These regions serve to block millimeter waves from entering or exiting an open slot (see FIG. 7) in the chamber which allows for vertical movement of the control shaft 210.

Electronics cable 232 may be connected to external power supplies and controllers (not shown in this figure). Electronics cable 232 provides electrical connections for laser pointer 228. Laser pointer 228 comprises a laser and associated optics for emitting a focused beam of visible light.

Horizontal transceiver support 220 is mounted to control shaft 210. A slidable transceiver holder 222 is slidably mounted to the horizontal transceiver support 220. A transceiver under test 224 is mounted to the transceiver holder 222 during use. As shown in FIG. 4, the slidable transceiver holder 222 is positioned such that the transceiver 224 is not in laser beam 226. Laser pointer 228 emits laser beam 226 which is centered on antenna 212. The alignment may be confirmed by visual inspection by an operator. The laser pointer 228 and antenna 212 may be fine-adjusted on laser mount 230 and antenna mount 214, respectively. This step ensures that the laser pointer 228 is aligned with the antenna 212.

FIG. 5 shows a side view of system 200 in accordance with a second embodiment of the present invention in a transceiver alignment configuration. In order to place system 200 into the transceiver alignment configuration, the motor 216 is operated to rotate the control shaft 210 to a position that is 180 degrees from the antenna alignment configuration shown in FIG. 4. Hence, the transceiver 224 is now facing the laser pointer 228.

In one embodiment, motor 216 is a stepper motor. The stepper motor may be used to precisely identify the 180 degree position for the transceiver alignment configuration. A positional encoder 217 may also be used to achieve additional positional accuracy. The transceiver 224 is positioned to be in the path of laser pointer 228 by sliding transceiver holder 222 into an extended position, such that laser beam 242 is positioned on the center of a corresponding antenna (or other desired location) of transceiver 224. The laser beam position may be confirmed by visual inspection by an operator.

FIG. 6 shows a side view of system 200 in accordance with a second embodiment of the present invention in a test configuration. The motor 216 is activated to return the control shaft 210 to a position that is 180 degrees from the transceiver alignment configuration of FIG. 5. The antenna 212 is now aligned with the transceiver 224. The antenna 212 then may be configured to emit electromagnetic waves 244 to test the transceiver 224.

FIG. 7 is a rear view of system 200. In this view, open slot 248 is shown. The control shaft (210 of FIG. 6) extends from the motor 216, through the open slot 248, and into the chamber of system 200. The motor 216, and control shaft 210 may be moved along the transceiver support post 218 to provide a vertical adjustment, which controls the distance between antenna 212 and transceiver 224 during test. Additional millimeter wave absorber regions (see 241 and 243 of FIG. 4) serve to prevent ingress or escape of electromagnetic radiation through open slot 248.

FIG. 8 is a block diagram of a system 800 in accordance with an embodiment of the present invention. System 800 comprises a main controller 818. Main controller 818 may be a computer comprising memory 820, and a processor 822 which is configured to read and write memory 820. The memory 820 may be non-transitory memory, such as flash, ROM, non-volatile static ram, or the like. The memory 820 contains instructions that, when executed by processor 822, control the various subsystems to operate system 800. Main controller 818 may also comprise a display 824 and a user interface 826 for interacting with the system 800. The user interface 826 may comprise a keyboard, touch screen, mouse, or the like.

The main controller 818 may send data to and receive data from millimeter wave test apparatus 810. Millimeter wave test apparatus 810 may be a movable antenna shaft embodiment as shown in FIGS. 1-3, or may be a fixed antenna shaft embodiment as shown in FIGS. 4-7. The processor 822 may access instructions stored in memory 820 and execute the instructions in order to control the motor (116 or 216 in FIGS. 1-7) to move the antenna or transceiver into the desired orientation for alignment or test. In some embodiments, the motor is a stepper motor, and the processor moves the stepper motor a predetermined number of steps to achieve a 180 degree position change between the transceiver alignment position (laser faces transceiver) and the transceiver testing position (antenna faces transceiver). The main controller 818 may read positional data from one or more encoders (117 or 217 in FIGS. 1-7) from the millimeter wave test apparatus 810 to more precisely determine the transceiver alignment position (laser faces transceiver) and the transceiver testing position (antenna faces transceiver). The processor 822 may also control activation and deactivation of the laser (128 or 228 in FIGS. 1-7). The processor 822 may execute instructions stored in memory 820 that record the position of the antenna shaft at the transceiver alignment position, and then compute the test position as 180 degrees from the transceiver alignment position.

FIG. 9 is a flowchart 900 for a method in accordance with an embodiment of the present invention. In process step 950, the antenna and laser are aligned (see FIG. 1 and FIG. 4). In process step 952, the transceiver is moved into an alignment position. In process step 954, the transceiver and laser are aligned (see FIG. 2 and FIG. 5). In process step 956, the transceiver is moved into a test position (see FIG. 3 and FIG. 6). The transceiver can then be tested by emitting electromagnetic waves from the antenna (see 144 of FIGS. 3 and 244 of FIG. 6).

As can now be appreciated, embodiments of the present invention provide an improved radiation signal measurement system for millimeter wave transceivers. Embodiments of the present invention utilize a laser to align the laser with an antenna. The transceiver is then moved into the path of the laser to align the laser with the transceiver. The transceiver or antenna orientation is changed such that the transceiver and antenna face each other, in an aligned position. Millimeter wave absorber material is applied to the inside and outside of the testing chamber to minimize reflections and interference from outside sources.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. An electromagnetic wave testing apparatus comprising:
a chamber;
an antenna shaft disposed within the chamber;
a control shaft affixed to the antenna shaft;
an antenna mount, said antenna mount movably attached to the antenna shaft at a first end of the antenna shaft;
an antenna affixed to the antenna mount;
a laser pointer mounted to the antenna shaft at an opposite end of the antenna shaft, the laser pointer configured and disposed to emit a laser beam onto the antenna; and
a transceiver holder, the transceiver holder configured and disposed to be moved such that the transceiver holder is positioned in the laser beam, wherein the control shaft is configured and disposed to rotate 180 degrees from an antenna alignment position to a transceiver alignment position.

2. The apparatus of claim 1, further comprising a motor configured and disposed to move the control shaft.

3. The apparatus of claim 2, wherein the motor is a stepper motor.

4. The apparatus of claim 2, further comprising a position encoder configured and disposed to indicate a rotational position of the control shaft.

5. The apparatus of claim 4, further comprising:
a processor;
non-transitory memory;
wherein the processor is configured and disposed to access the non-transitory memory, and wherein the non-transitory memory contains instructions, that when executed by the processor, record an encoded position of the control shaft.

6. The apparatus of claim 1, wherein the chamber is comprised of wood.

7. The apparatus of claim 1, wherein the chamber is comprised of plastic.

8. The apparatus of claim 1, wherein the antenna shaft is comprised of polyoxymethylene.

9. The apparatus of claim 1, further comprising a first millimeter wave absorber layer disposed on the inside of the chamber and a second millimeter wave absorber layer disposed on the outside of the chamber.

10. The apparatus of claim 9, wherein the first millimeter wave absorber layer and the second millimeter wave absorber layer are comprised of a material selected from the group consisting of: urethane rubber mixed with carbon particles, epoxy resin containing carbon particles, and polyester non-woven cloth.

11. An electromagnetic wave testing apparatus comprising:
a chamber;
an antenna shaft disposed within the chamber;
an antenna mount, attached to the antenna shaft at a first end of the antenna shaft;
an antenna affixed to the antenna mount;
a waveguide configured and disposed to supply electromagnetic energy to the antenna;
a laser pointer mounted to the antenna shaft at an opposite end of the antenna shaft, the laser pointer configured and disposed to emit a laser beam onto the antenna;
a control shaft positioned within the chamber;
a horizontal transceiver support mounted to the control shaft, wherein the control shaft is configured and disposed to rotate 180 degrees from an antenna alignment position to a transceiver alignment position; and
a slidable transceiver holder slidably attached to the horizontal transceiver support.

12. The apparatus of claim 11, further comprising a motor configured and disposed to move the control shaft.

13. The apparatus of claim 12, wherein the motor is a stepper motor.

14. The apparatus of claim 12, further comprising a position encoder configured and disposed to indicate a rotational position of the control shaft.

15. The apparatus of claim 14, further comprising:
a processor;
non-transitory memory;
wherein the processor is configured and disposed to access the non-transitory memory, and wherein the non-transitory memory contains instructions, that when executed by the processor, establish the position of the control shaft.

16. The apparatus of claim 11, further comprising:
a slot in the chamber, wherein the control shaft is configured and disposed to move along the slot; and
a millimeter wave absorber affixed to the control shaft.

17. A method of configuring an electromagnetic wave testing chamber, comprising:
aligning a laser pointer and an antenna, wherein the laser pointer and the antenna are mounted on opposite ends of an antenna shaft;
aligning the laser pointer and a transceiver under test by rotating the antenna shaft 180 degrees to a transceiver alignment position;
sliding a transceiver holder into an extended position such that the transceiver is in a path of the laser pointer; and
rotating the antenna shaft 180 degrees to a test position, such that the antenna is aligned to the transceiver under test.

18. The method of claim 17, wherein orienting the antenna shaft to a transceiver alignment position comprises:
activating a stepper motor which is configured an disposed to move the antenna shaft to the transceiver alignment position.

19. The method of claim 18, wherein orienting the antenna shaft to a test position comprises: activating the stepper motor to move the antenna shaft to the test position.

* * * * *